(12) United States Patent
Jo et al.

(10) Patent No.: US 11,128,315 B2
(45) Date of Patent: Sep. 21, 2021

(54) ERROR CORRECTION DECODER

(71) Applicant: SK hynix Inc., Icheon-si (KR)

(72) Inventors: Myung Jin Jo, Seongnam-si (KR); Dae Sung Kim, Icheon-si (KR); Wan Je Sung, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 84 days.

(21) Appl. No.: 16/596,550

(22) Filed: Oct. 8, 2019

(65) Prior Publication Data
US 2020/0313693 A1 Oct. 1, 2020

(30) Foreign Application Priority Data
Mar. 27, 2019 (KR) .......................... 10-2019-0035392

(51) Int. Cl.
*H03M 13/11* (2006.01)
*H03M 13/25* (2006.01)

(52) U.S. Cl.
CPC .... *H03M 13/1125* (2013.01); *H03M 13/1128* (2013.01); *H03M 13/253* (2013.01)

(58) Field of Classification Search
None
See application file for complete search history.

(56) References Cited

U.S. PATENT DOCUMENTS

| | | | |
|---|---|---|---|
| 8,230,298 B2* | 7/2012 | Tran | H03M 13/1162 714/758 |
| 8,301,979 B2* | 10/2012 | Sharon | H03M 13/1128 714/763 |
| 9,847,195 B2* | 12/2017 | Neubauer | H01H 23/025 |
| 2005/0268206 A1* | 12/2005 | Tran | H04L 27/18 714/758 |
| 2019/0149168 A1* | 5/2019 | Chang | H03M 13/1108 714/752 |

FOREIGN PATENT DOCUMENTS

| | | |
|---|---|---|
| KR | 10-2015-0017948 | 2/2015 |
| KR | 10-2018-0009558 | 1/2018 |

\* cited by examiner

*Primary Examiner* — Phung M Chung
(74) *Attorney, Agent, or Firm* — Perkins Coie LLP

(57) ABSTRACT

Devices and methods for error correction are described. An exemplary error correction decoder includes a mapper configured to generate, based on a first set of read values corresponding to a first codeword, a first set of log likelihood ratio (LLR) values; a first buffer, coupled to the mapper, configured to store the first set of LLR values received from the mapper; and a node processor, coupled to the first buffer, configured to perform a first error correction decoding operation using the first set of LLR values received from the first buffer, wherein a first iteration of the first error correction decoding operation comprises refraining from updating values of one or more variable nodes, and performing a syndrome check using a parity check matrix and sign bits of the first set of LLR values stored in the first buffer.

20 Claims, 14 Drawing Sheets

FIG. 7

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | −4 | +4 | | | | | | |
| 3 | −4 | −2 | +4 | | | | | |
| 4 | −4 | −2 | +2 | +4 | | | | |
| 5 | −4 | −3 | −2 | +2 | +4 | | | |
| 6 | −4 | −3 | −2 | −1 | +2 | +4 | | |
| 7 | −4 | −3 | −2 | −1 | +1 | +2 | +4 | |
| 8 | −4 | −3 | −2 | −1 | +1 | +2 | +3 | +4 |

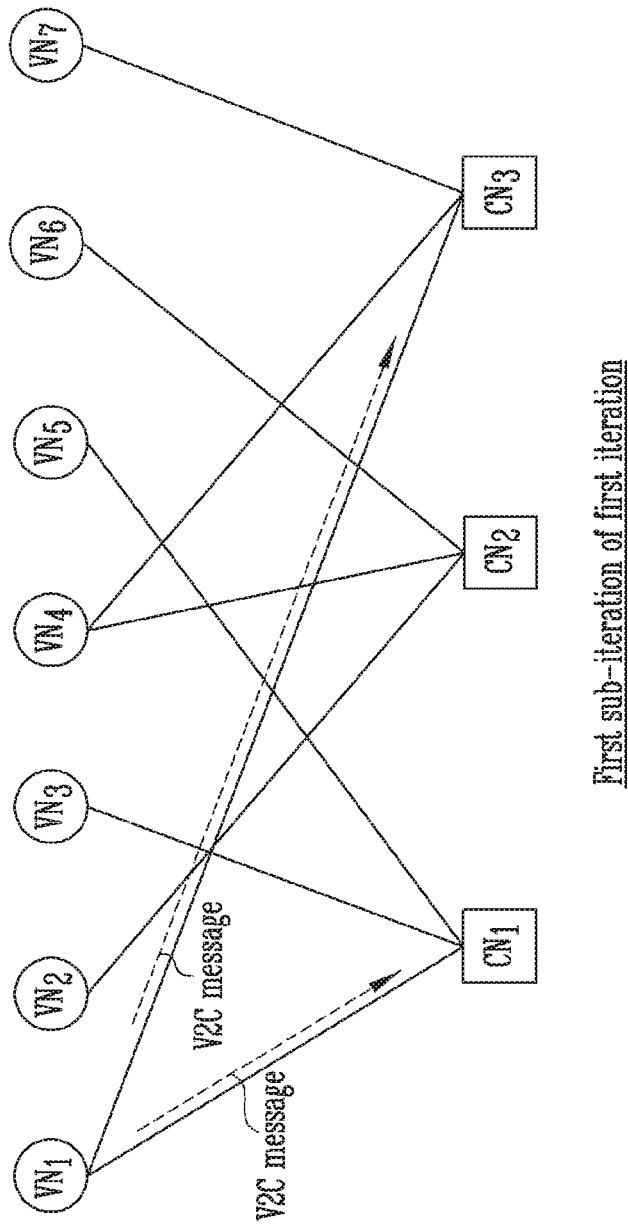

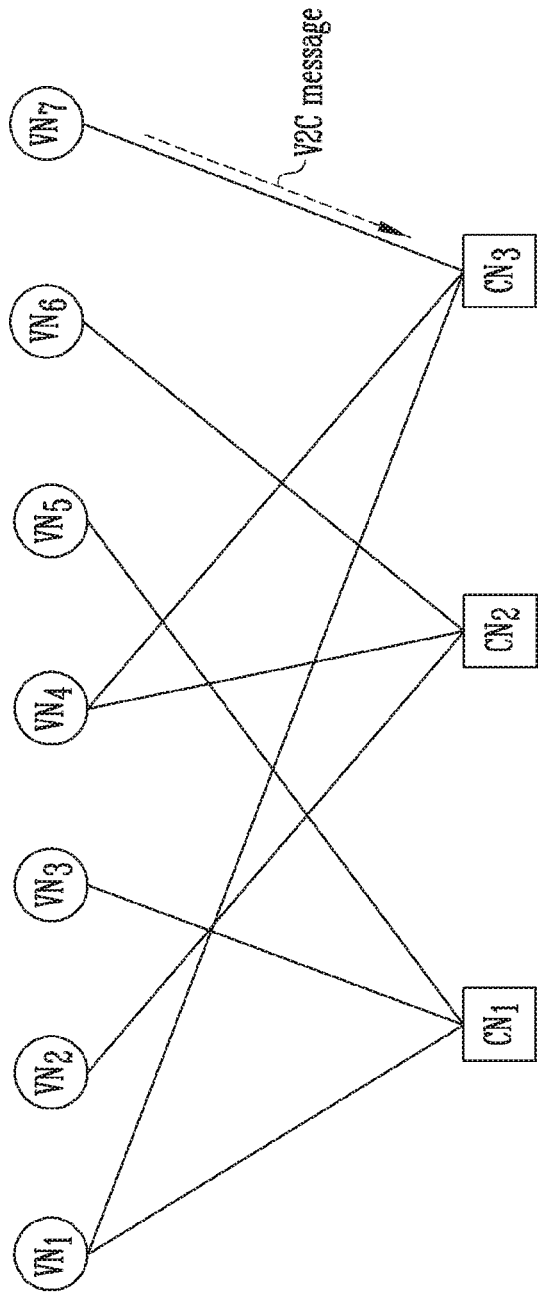

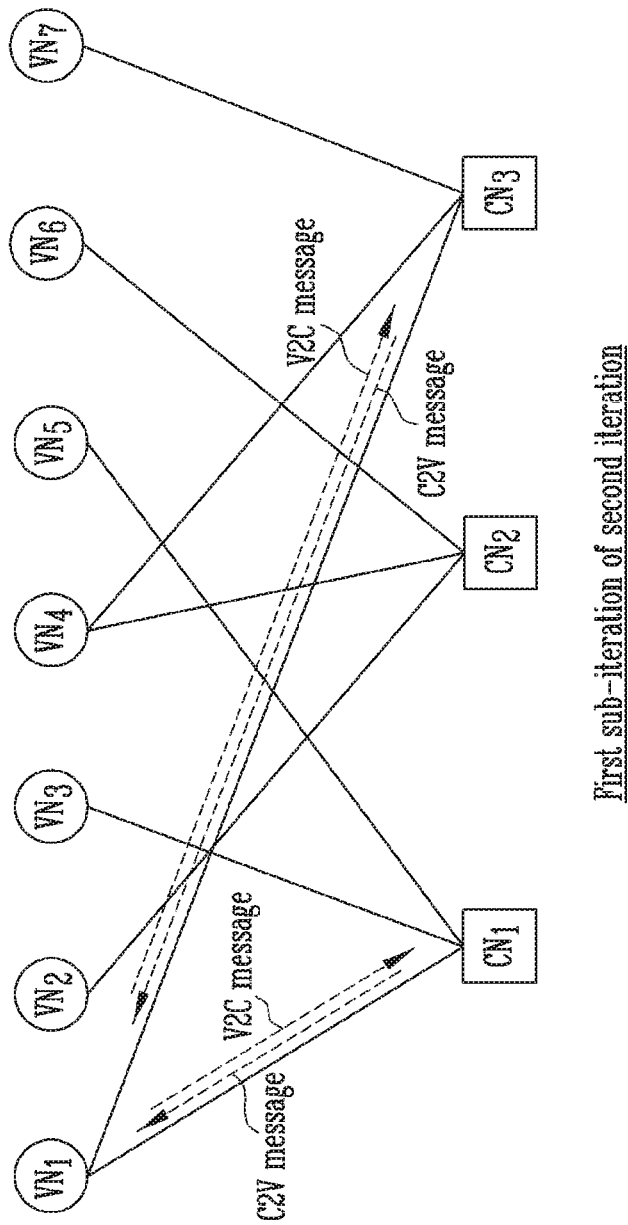

ERROR CORRECTION DECODER

CROSS-REFERENCE TO RELATED APPLICATION

This patent document claims priority to and benefits of the Korean patent application number 10-2019-0035392, filed on Mar. 27, 2019, which is incorporated herein by reference in its entirety for all purposes.

TECHNICAL FIELD

Various embodiments of the present disclosure generally relate to an error correction decoder, and more particularly, to an error correction decoder using an iterative decoding scheme.

BACKGROUND

A memory system may store data provided by an external device, and may provide stored data to the external device. The memory system may include an error correction circuit to guarantee the reliability of data. The error correction circuit may perform error correction encoding and error correction decoding using an error correction code.

A low-density parity check (LDPC) code is an example of a powerful error correction code. The efficacy of the LDPC is due to the characteristics of an LDPC iterative decoding scheme in which, as the length of a code is increased, the error correction capability per bit increases, whereas the computational complexity per bit remains unchanged.

SUMMARY

Various embodiments of the present disclosure are directed to an error correction decoder that enables the number of buffers required for error correction decoding to be reduced.

An embodiment of the present disclosure may provide for an error correction decoder. The error correction decoder may include a mapper configured to generate, based on a first set of read values corresponding to a first codeword, a first set of log likelihood ratio (LLR) values; a first buffer, coupled to the mapper, configured to store the first set of LLR values received from the mapper; and a node processor, coupled to the first buffer, configured to perform a first error correction decoding operation using the first set of LLR values received from the first buffer, wherein a first iteration of the first error correction decoding operation comprises refraining from updating values of one or more variable nodes, and performing a syndrome check using a parity check matrix and sign bits of the first set of LLR values stored in the first buffer.

Another embodiment of the present disclosure may provide for an error correction decoding method. The error correction decoding method may include generating, based on a first set of read values corresponding to a first codeword, a first set of log likelihood ratio (LLR) values; storing the first set of LLR values in a first buffer; and performing a first error correction decoding operation using the first set of LLR values, wherein a first iteration of the first error correction decoding operation comprises refraining from updating values of one or more variable nodes, and performing a syndrome check using a parity check matrix and sign bits of the first set of LLR values stored in the first buffer.

Yet another embodiment of the present disclosure may provide for an error correction decoder. The error correction decoder may include a mapper configured to generate, based on first read values corresponding to a first codeword, first log likelihood ratio (LLR) values including sign bits and magnitude bits; a first buffer configured to store the first LLR values received from the mapper; and a node processor configured to perform first error correction decoding using the first LLR values received from the first buffer, wherein the node processor is configured to: prevent the values of the variable nodes from being updated in a first iteration of the first error correction decoding, and perform a syndrome check using a parity check matrix and the sign bits, among the first LLR values stored in the first buffer, in the first iteration of the first error correction decoding.

BRIEF DESCRIPTION OF THE DRAWINGS

FIG. 7 is an example of a lookup table.

FIGS. 8A to 8D are example diagrams illustrating a column-layered scheme.

DETAILED DESCRIPTION

Figures 1, 2:
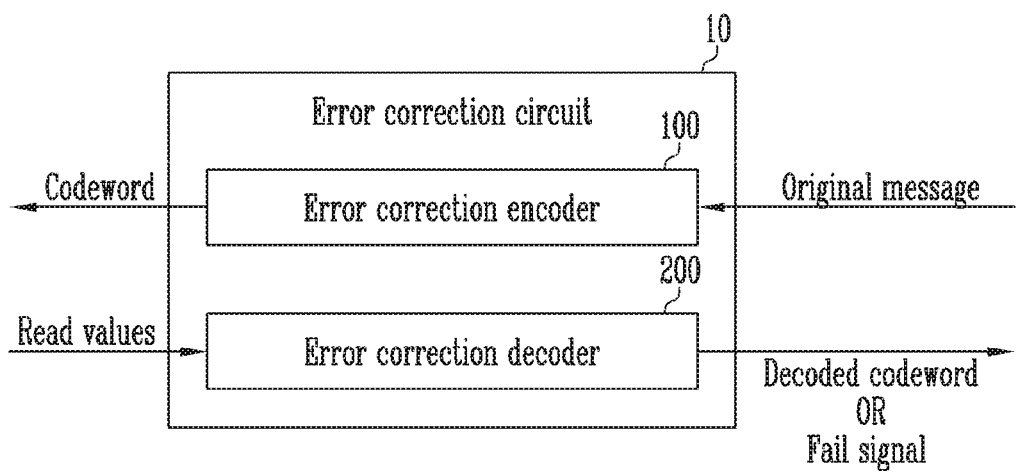
FIG. 1 is a diagram illustrating an error correction circuit according to an embodiment of the present disclosure.
FIG. 2 is an example diagram illustrating a parity check matrix.

FIG. 1 is a diagram illustrating an example of an error correction circuit according to an embodiment of the present disclosure.

Referring to FIG. 1, an error correction circuit 10 may include an error correction encoder 100 and an error correction decoder 200.

The error correction encoder 100 may receive an original message that is intended to be encoded, and may perform error correction encoding using the received original message and a generator matrix of an error correction code (ECC). In some embodiments, the error correction encoder 100 may also perform error correction encoding using the received original message and a parity check matrix of the error correction code. The error correction encoder 100 outputs a codeword, generated as a result of performing error correction encoding, which is then transmitted through a channel.

The channel may refer to a wired or wireless medium through which information is transferred or a storage medium in which information is stored. When the error correction circuit 10 is applied to a memory system, the channel may refer to either an interface which transmits and receives data between the error correction circuit 10 and a memory device, or the memory device itself. When the error correction circuit 10 is applied to the memory system, each codeword may be stored in a plurality of memory cells (e.g., memory cells constituting a single page) included in the memory device.

In some embodiments, the error correction encoder 100 may use a low-density parity check (LDDC) code as the error correction code, but embodiments of the present disclosure are not limited thereto.

In some embodiments, the error correction decoder 200 may receive read values corresponding to a codeword from the channel, and may then perform error correction decoding using the received read values and the parity check matrix of the error correction code.

In some embodiments, the error correction decoder 200 may perform error correction decoding using various algorithms which implement an iterative decoding scheme. For example, the error correction decoder 200 may perform error correction decoding using a message passing algorithm (MPA) that is also referred to as a "belief propagation algorithm (BPA)". For example, the error correction decoder 200 may perform error correction decoding using a sum-product algorithm or a min-sum algorithm, but embodiments of the present disclosure are not limited thereto.

In some embodiments, the error correction decoder 200 may perform error correction decoding by performing at least one iteration without exceeding a maximum number of iterations I specified in the iterative decoding scheme. When a valid codeword that satisfies constraints for the parity check matrix of the error correction code (ECC) is generated within the maximum number of iterations I, the error correction decoder 200 may output the generated valid codeword as a decoded codeword. When valid codeword that satisfies the constraints for the parity check matrix of the error correction code is not generated within the maximum number of iterations I, the error correction decoder 200 may output a fail signal indicating that error correction decoding has failed.

In some embodiments, the error correction decoder 200 may use a low-density parity check (LDPC) code as the error correction code, but embodiments of the present disclosure are not limited thereto.

In some embodiments, the error correction circuit 10 may further include a post processor configured to support the error correction decoder 200 so that the error correction decoder 200 can generate a valid codeword. The post processor may support the error correction decoder 200 so that various types of parameters used for the error correction decoding operation are modified and the error correction decoding operation is performed using the modified parameters.

FIG. 2 illustrates an example of a parity check matrix, which describes the linear relationships that the components of a codeword must satisfy. It can be used to decide whether a particular vector is a codeword and is also used in decoding algorithms.

An (n, k) code may be defined using a parity check matrix having a size of (n-k)×n. Here, k denotes the length of an original message and n-k denotes the number of parity bits. Each entry of the parity check matrix may be represented by '0' or '1'. The (n, k) code may be referred to as an "(n, k) LDPC code" when the number of 1s included in the parity check matrix is much less than the number of 0 s. Here, n and k may be natural numbers. FIG. 2, as an example, illustrates the parity check matrix of a (7, 4) code.

A matrix in which each entry is implemented as a sub-matrix may be referred to as a "base matrix". Each entry of the base matrix may be a sub-matrix having a z×z size. Here, z may be an integer great than or equal to 2. For example, '0' in the base matrix may indicate that the corresponding entry is a zero matrix (of size z×z), and '1' in the base matrix may indicate that the corresponding entry is not a zero matrix. For example, when the base matrix is used for a Quasi Cyclic (QC)-LDPC code, '1' may indicate that the corresponding entry is a circulant matrix. The circulant matrix is a matrix obtained by cyclically shifting an identity matrix by a predetermined shift value. In an example, any one circulant matrix may have a shift value different from that of another circulant matrix in the base matrix.

Figure 3:
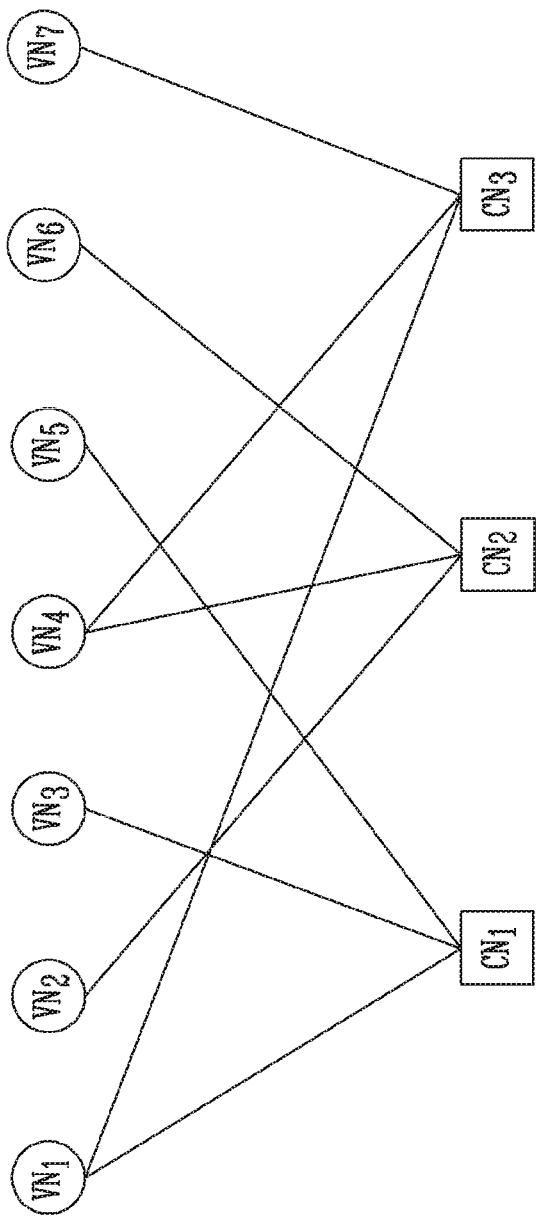
FIG. 3 is a diagram illustrating the parity check matrix of FIG. 2 as a Tanner graph.

FIG. 3 illustrates a Tanner graph that corresponds to the parity check matrix of FIG. 2.

An (n, k) code may be represented by a Tanner graph which is an expression of an equivalent bipartite graph, and is represented by n-k check nodes, n variable nodes, and edges. The check nodes correspond to the rows of the parity check matrix, and the variable nodes correspond to the columns of the parity check matrix. Each edge connects one check node to one variable node, and indicates a '1' entry in the parity check matrix.

The parity check matrix of the (7, 4) code illustrated in FIG. 2 may be represented by the Tanner graph illustrated in FIG. 3, which includes three check nodes $CN_1$ to $CN_3$ and seven variable nodes $VN_1$ to $VN_7$. Solid lines connecting the check nodes $CN_1$ to $CN_3$ to the variable nodes $VN_1$ to $VN_7$ indicate edges.

Iterative decoding may be performed, based on a message passing algorithm on the Tanner graph, through the exchange of messages between the check nodes $CN_1$ to $CN_3$ and the variable nodes $VN_1$ to $VN_7$. For example, iterative decoding may be performed by transferring messages between the check nodes $CN_1$ to $CN_3$ and the variable nodes $VN_1$ to $VN_7$ in each iteration.

Figures 4, 5:
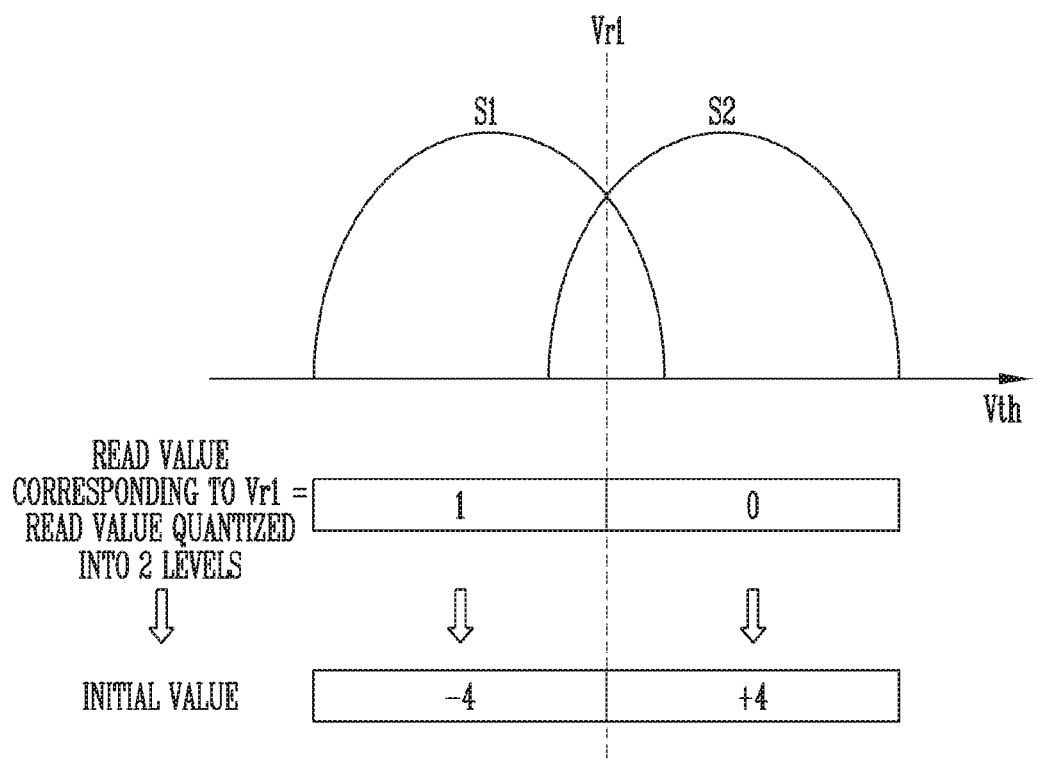
FIG. 4 is an example diagram illustrating the calculation of a syndrome vector using the parity check matrix of FIG. 2.
FIG. 5 is an example diagram illustrating the procedure for generating initial soft values using one read value in hard decision decoding.

FIG. 4 is an example diagram illustrating the calculation of a syndrome vector using the parity check matrix of FIG. 2.

As illustrated therein, a syndrome vector $S_i$ may be generated as a product of a parity check matrix H and a transposed vector $C_i^T$ of a hard decision vector $C_i$ corresponding to an i-th iteration. In this example, the hard decision vector $C_i$ is assumed to be a row vector.

All of symbols $S_{i1}$, $S_{i2}$, and $S_{i3}$ of the syndrome vector Si being '0' indicates that a syndrome check has passed (succeeded). This means that, in the i-th iteration, error correction decoding has been successfully performed. Therefore, iterative decoding of current read values may be terminated, and the hard decision vector $C_i$ corresponding to the i-th iteration may be output as a decoded codeword.

On the contrary, when at least one of the symbols $S_{i1}$, $S_{i2}$, and $S_{i3}$ of the syndrome vector $S_i$ is not '0' indicates that a syndrome check has failed. This means that, in the i-th iteration, error correction decoding has not succeeded. Thus, if the current iteration has not exceeded the maximum number of iterations I, a subsequent iteration may be performed. On the other hand, when the current iteration has reached the maximum number of iterations iterative decoding of the current read values may be terminated, and the error correction decoding operation is deemed to have failed.

FIG. 5 is an example diagram illustrating the procedure for generating initial soft values using one read value in hard decision decoding.

In the example in FIG. 5, threshold voltage distributions Vth of memory cells, each having any one of a first state S1 and a second state S2, are illustrated.

In order to acquire a single read vector corresponding to a single codeword, a single read voltage Vr1 may be applied to a plurality of memory cells (e.g., memory cells constituting a single page) which store a single codeword. Accordingly, a single read value per memory cell may be acquired. A single read vector may be composed of read values corresponding to the plurality of memory cells.

For example, when the first read voltage Vr1 is applied to the plurality of memory cells, a read value from a memory cell having a threshold voltage lower than the first read voltage Vr1 may be a '1', and a read value from a memory cell having a threshold voltage higher than the first read voltage Vr1 may be a '0'. As illustrated in this example, the read values corresponding to the first read voltage Vr1 may be read values quantized into two levels.

The error correction circuit 10 may convert the read values quantized into two levels into initial soft values (e.g., log likelihood ratio (LLR) values). In an example, the conversion into the initial soft values may be performed based on a lookup table.

Figure 6:
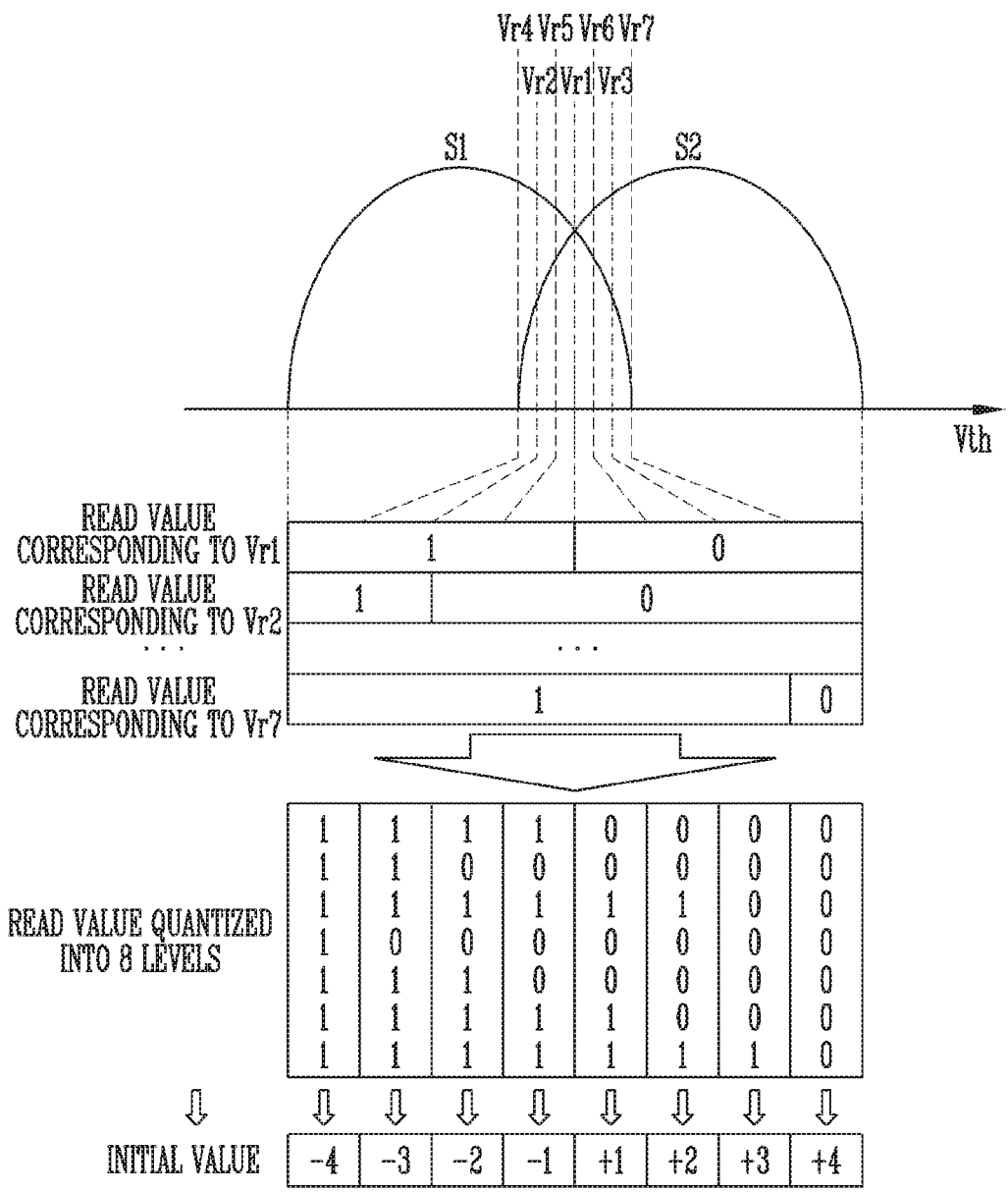
FIG. 6 is an example diagram illustrating the procedure for generating initial soft values using g read values in soft decision decoding.

FIG. 6 is an example diagram illustrating the procedure for generating initial soft values using g read values in soft decision decoding.

In the example in FIG. 6, threshold voltage (Vth) distributions of memory cells having any one of a first state S1 and a second state S2 are illustrated.

When a (g+1)-level quantization is used, each of g read voltages may be sequentially applied to a plurality of memory cells in order to acquire g read vectors corresponding to a single codeword. In an example, g may be a natural number. For example, as illustrated in FIG. 6, when a 2-level quantization is used, one read voltage Vr1 may be applied, and when a 3-level quantization is used, two read voltages Vr1 and Vr2 may be sequentially applied. Similarly, when an 8-level quantization is used, seven read voltages Vr1 to Vr7 may be sequentially applied. Thus, when a (g+1)-level quantization is used, g read values may be acquired from each memory cell.

In an example, when any one of the g read voltages is applied to the plurality of memory cells, a read value from a memory cell having a threshold voltage lower than the applied read voltage may be a '1', and a read value from a memory cell having a threshold voltage higher than the applied read voltage may be a '0'.

The error correction circuit may generate read values quantized into g+1 levels by combining read values respectively corresponding to the g read voltages. For example, as illustrated in FIG. 6, when seven read voltages Vr1 to Vr7 are used, the error correction circuit may generate read values quantized into eight levels by combining read values respectively corresponding to the seven read voltages Vr1 to Vr7.

The error correction circuit may convert the read values quantized into g+1 levels into initial soft values (e.g., LLR values). Conversion into the initial soft values may be performed based on a lookup table.

In the following descriptions, the term "read values" may refer to read values quantized into g+1 levels.

FIG. 7 is an example diagram of a lookup table, which may define LLR values corresponding to a plurality of quantization levels.

The error correction circuit may convert each of the read values, quantized into g+1 quantization levels, into any one of g+1 LLR values corresponding to the (g+1) quantization levels, based on the lookup table.

For example, when a 2-level quantization is used, the error correction circuit may convert one of read values into LRR1 and convert the other read value into LLR2. For example, a '1' may be converted into LLR1='−4', and a '0' may be converted into LLR2='+4'.

FIGS. 8A to 8D are example diagrams illustrating a column-layered scheme, which is a type of message passing algorithm.

More generally, a message passing algorithm may be classified as a flooding scheme, a row-layered scheme or a column-layered scheme depending on a scheduling scheme.

In the example of a flooding scheme, in each iteration, the update of all check nodes is simultaneously performed, and the update of all variable nodes is simultaneously performed. For example, in each iteration, before the values of all the check nodes are updated, all variable nodes should be updated. Similarly, in each iteration, before the values of all variable nodes are updated, the values of all check nodes should be updated.

In the example of a column-layered scheme, in respective iterations except in a first iteration, the update of variable nodes may be sequentially performed. Thus, in all iterations except for the first iteration, the result of a calculation on a previously calculated variable node influences the result of calculation on a variable node to be subsequently calculated. Therefore, for the column-layered scheme, the speed of convergence for a codeword is higher than that for the flooding scheme. Each iteration in the column-layered scheme may include sub-iterations respectively corresponding to a plurality of variable nodes.

Some embodiments of a column-layered scheme, alternatively referred to as a vertically shuffled scheduling (VSS) scheme, include an LDPC decoder selecting sub-matrices that share the same layer (or layer index, or column index) among a plurality of sub-matrices forming the parity check matrix and performing a variable node selecting operation of selecting variable nodes that correspond to the columns forming the selected sub-matrices.

In an example, the LDDC decoder may provide variable node messages from the selected variable nodes to the check nodes connected to the selected variable nodes. The LDPC decoder may perform a check node updating operation based on the provided variable node messages for the check nodes provided with the variable node messages. The check nodes performing the check node updating operation may provide the check node message to the variable nodes connected to the check nodes. The LDPC decoder may perform a variable node updating operation on the variable nodes provided with the check node messages based on the provided check node messages. The LDPC decoder may perform the LDPC decoding operation in the vertically shuffled scheduling method by repeatedly performing the variable node selecting operation, the check node updating operation, and the variable node updating operation, until the UPC decoding operation is performed successfully. An example operation of a VSS scheme is illustrated in FIGS. 8A through 8D.

As illustrated in FIG. 8A, variable-node-to-check-node (V2C) messages generated by a variable node $VN_1$ in a first sub-iteration (corresponding to processing one or more columns of the parity check matrix) of the first iteration may be sent to check nodes $CN_1$ and $CN_3$. Thereafter, V2C messages generated by variable nodes $VN_2$ to $VN_6$ in a second to sixth sub-iterations of the first iteration, which are sequentially performed, may be sent to the check nodes $CN_1$ to $CN_3$. Then, a V2C message generated by a variable node $VN_7$ in a seventh sub-iteration of the first iteration be sent to the check node $CN_3$.

In the first iteration described above with reference to FIGS. 8A and 8B, the V2C messages are sent from the variable nodes to the check nodes, but check-node-to-variable-node (C2V) messages are not sent from the check nodes to the variable nodes. Therefore, in the first iteration, the values of the check nodes are updated, but the values of the variable nodes are not updated.

Thereafter, as illustrated in FIG. 8C, C2V messages generated by the check nodes $CN_1$ and $CN_3$ in a first sub-iteration of a second iteration may be sent to the variable node $VN_1$. Based on the C2V messages received from the check nodes $CN_1$ and $CN_3$, the value of the variable node $VN_1$ may be updated, and V2C messages may be generated and sent to the check nodes $CN_1$ and $CN_3$. Then, the values of the check nodes $CN_1$ and $CN_3$ may be updated based on the V2C messages received from the variable node $VN_1$.

Thereafter, C2V messages generated by the check nodes $CN_1$ to $CN_3$ in second to sixth sub-iterations of the second iteration, which are sequentially performed, may be sent to the variable nodes $VN_2$ to $VN_6$. Accordingly, the values of the variable nodes $VN_2$ to $VN_6$ may be updated, and V2C messages may be generated and sent to the check nodes $CN_1$ to $CN_3$. Then, the values of the check nodes $CN_1$ to $CN_3$ may be updated.

Figure 8D:
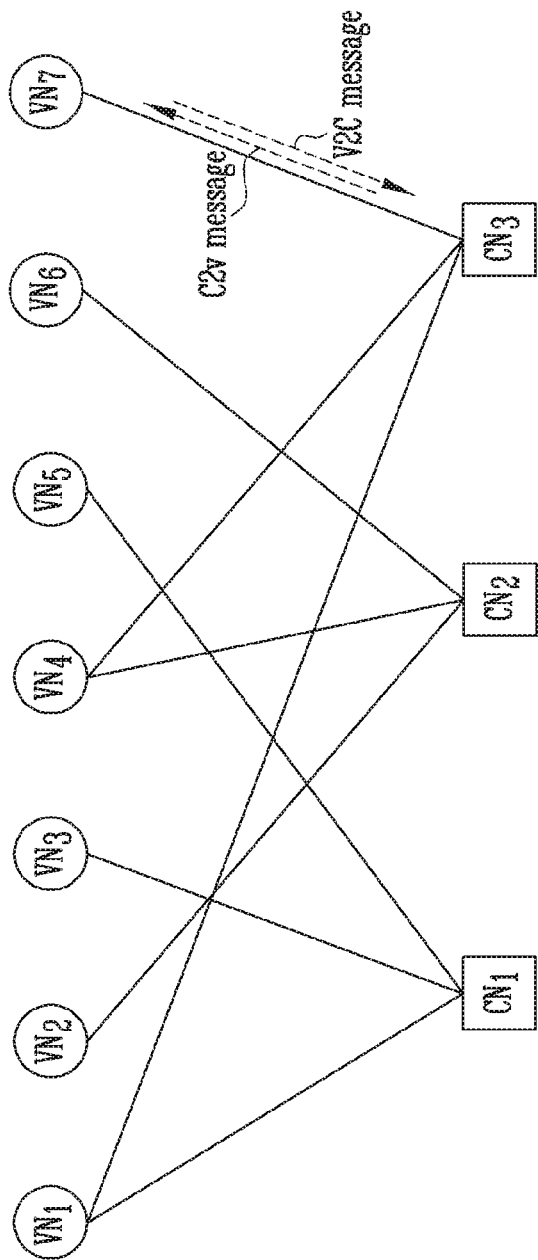

Thereafter, as illustrated in FIG. 8D, a C2V message generated by the check node $CN_3$ in a seventh sub-iteration of the second iteration may be sent to the variable node $VN_7$. Based on the C2V message received from the check node $CN_3$, the value of the variable node $VN_7$ may be updated, and a V2C message may be generated and sent to the check node $CN_3$. Furthermore, the value of the check node $CN_3$ may be updated based on the V2C message received from the variable node $VN_7$.

Iterations subsequent to the second iteration may be performed in a manner similar to that described for the second iteration.

For conventional error correction decoding, two output buffers are used in addition to one input buffer which receives read values corresponding to a codeword. In a typical operation, a first of the two output buffers is used to store the values of variable nodes which are updated during a first error correction decoding operation that uses first read values corresponding to a first codeword. When the first error correction decoding operation has passed, it takes time for the values of variable nodes to be output from the first output buffer as a decoded codeword, and thus a second of the two output buffers is used to store the values of the variable nodes which are updated during a second error correction decoding operation that uses second read values corresponding to a second codeword. When the number of buffers to be used for the error correction decoding operation is reduced, the size of the error correction decoder itself is reduced.

Embodiments of the presently disclosed technology provide methods and systems that advantageously reduce the number of buffers to be used for error correction decoding. In an example, the described embodiments may be applied to a case where the values of check nodes are updated in a first iteration, but the values of variable nodes are not updated in the first iteration.

For example, the described embodiments may be applied to a column-layered (or VSS) scheme, but embodiments of the present disclosure are not limited thereto. For example, the embodiments of the present disclosure may also be applied to cases where the values of variable nodes corresponding to a first iteration are not updated in a flooding scheme or a row-layered scheme.

Figure 9:
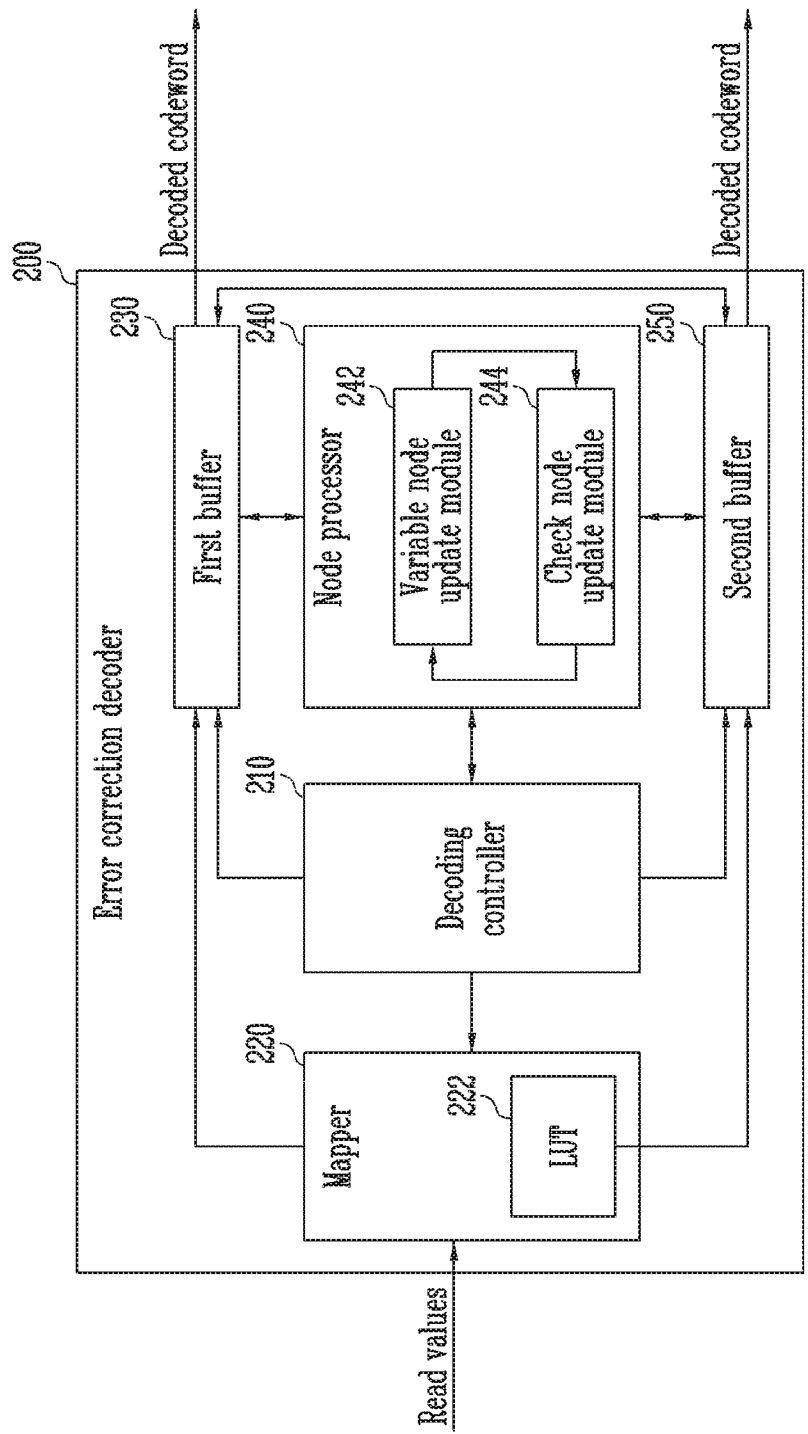
FIG. 9 is an example diagram illustrating an error correction decoder according to an embodiment of the present disclosure.

FIG. 9 is an example diagram illustrating an error correction decoder according to an embodiment of the present disclosure.

As illustrated therein, an error correction decoder 200 may include a decoding controller 210, a mapper 220, a first buffer 230, a node processor 240, and a second buffer 250.

The decoding controller 210 may control the mapper 220 so that the mapper 220 receives read values corresponding to a codeword and generates initial soft values based on the received read values.

In a first embodiment, the decoding controller 210 may control the mapper 220 so that the initial soft values are stored in the first buffer 230. In this embodiment, the first buffer 230 may be used only as an input buffer, and the second buffer 250 may be used only as an output buffer.

In a second embodiment, the decoding controller 210 may select a buffer in which the initial soft values are to be stored between the first buffer 230 and the second buffer 250. In this embodiment, the decoding controller 210 may control the mapper 220 so that the initial soft values are stored in the selected buffer. In this embodiment, the functions of the first buffer 230 and the second buffer 250 may be interchanged with each other. That is, when the first buffer 230 is used as the output buffer, the second buffer 50 may be used as the input buffer, whereas when the second buffer 250 is used as the output buffer, the first buffer 230 may be used as the input buffer.

The decoding controller 210 may control the node processor 240 so that the error correction decoding operation is performed using the initial soft values.

In the first embodiment, the decoding controller 210 may control the node processor 240 so that the error correction decoding operation is performed using the initial soft values stored in the first butter 230.

In the second embodiment, the decoding controller 210 may control the node processor 240 so that error correction decoding can be performed using the initial soft values stored in the buffer selected between the first buffer 230 and the second buffer 250.

The decoding controller 210 may receive the results of a syndrome check corresponding to respective iterations from the node processor 240, and may control at least one of the mapper 220, the first buffer 230, the node processor 240, or the second buffer 250 based on the received syndrome check results.

When a notification that the syndrome check has failed is received from the node processor 240, the decoding controller 210 may control at least one of the mapper 220, the first buffer 230, the node processor 240, or the second buffer 250 such that a subsequent iteration is performed. When a current iteration has reached the maximum number of iterations I, the decoding controller 210 may output a fail signal indicating that error correction decoding has failed.

In the first embodiment, the decoding controller 210 may control the node processor 240 so that the values of variable nodes that are updated in an iteration subsequent to the first iteration are stored in the second buffer 250.

In the second embodiment, the decoding controller 210 may select a buffer in which the values of the variable nodes are to be stored between the first buffer 230 and the second buffer 250. Furthermore, the decoding controller 210 may control the node processor 240 so that the values of the variable nodes that are updated in the iteration subsequent to the first iteration are stored in the selected buffer.

When a notification that the syndrome check has passed is received from the node processor 240, the decoding controller 210 may control at least one of the mapper 220, the first buffer 230, the node processor 240, or the second buffer 250 so that error correction decoding operation is performed using read values corresponding to a next codeword.

The mapper 220 may receive read values corresponding to the next codeword, and may generate initial soft values based on the received read values. The initial soft values may be LLR values including sign bits and magnitude bits. For example, the mapper 220 may convert the read values into initial soft values based on a lookup table (LUT) 222.

In the first embodiment, the mapper 220 may store the initial soft values in the first buffer 230.

In the second embodiment, the mapper 220 may store the initial soft values in the buffer selected by the decoding controller 210 between the first buffer 230 and the second buffer 250.

The node processor 240 may perform error correction decoding based on the initial soft values.

In the first embodiment, the node processor 240 may perform error correction decoding using the initial soft values stored in the first buffer 230.

In the second embodiment, the node processor 240 may perform error correction decoding using the initial soft values stored in the buffer selected by the decoding controller 210 between the first buffer 230 and the second buffer 250.

The node processor 240 may include a variable node update module 242 and a check node update module 244.

At an initialization step, the variable node update module 242 may initialize the variable nodes using the initial soft values. For example, the variable node update module 242 may assign the initial soft values to respective variable nodes sequentially. Each of the initial soft values may include a sign bit and a magnitude bit. A sequence of magnitude bits, from the sign bits and the magnitude bits included in the initial soft values, may be referred to as a "hard decision vector".

In some embodiments of the present disclosure, a first iteration may include an operation in which V2C messages are sent from the variable nodes to the check nodes, an operation in which the values of the check nodes are updated based on the V2C messages, and an operation in which a syndrome check is performed using initial soft values and a parity check matrix.

In the first iteration, the variable node update module 242 may generate V2C messages based on the initial soft values, and may send the generated V2C messages to the check node update module 244.

In the first iteration, the check node update module 244 may update the values of the check nodes using the V2C messages received from the variable node update module 242. The check node update module 244 may perform a syndrome check based on the hard decision vector and the parity check matrix, and may notify the decoding controller 210 of the result of the syndrome check. When the syndrome check has succeeded (passed) in the first iteration, an error correction decoding operation on read values corresponding to a next codeword may be performed. On the other hand, when the syndrome check has failed in the first iteration, a subsequent iteration may be performed.

In the first embodiment, the check node update module 244 may receive the hard decision vector from the first buffer 230, and may perform a syndrome check based on the received hard decision vector and the parity check matrix.

In the second embodiment, the check node update module 244 may receive the hard decision vector, from the initial soft values stored in the buffer selected by the decoding controller 210 between the first buffer 230 and the second buffer 250, and may perform the syndrome check based on the received hard decision vector and the parity check matrix.

In some embodiments of the present disclosure, each iteration subsequent to the first iteration may include an operation in which C2V messages are sent from the check nodes to the variable nodes, an operation in which the values of the variable nodes are updated based on the C2V messages, an operation in which V2C messages are sent from the variable nodes to the check nodes, an operation in which the values of the check nodes are updated based on the V2C messages, and an operation in which a syndrome check is performed using the updated values of the variable nodes and the parity check matrix.

In the iteration subsequent to the first iteration, the check node update module 244 may generate C2V messages based on the values of the check nodes, updated in the previous iteration, and may send the generated C2V messages to the variable node update module 242.

In the iteration subsequent to the first iteration, the variable node update module 242 may update the values of the variable nodes and generate V2C messages, based on the initial soft values and the C2V messages received from the check node update module 244. The generated V2C messages may be sent to the check node update module 244. The updated values of the variable nodes may be composed of sign bits. Thus, the updated values of the variable nodes may be referred to as a "hard decision vector".

In the first embodiment, the variable node update module 242 may update the values of the variable nodes based on the initial soft values received from the first buffer 230 and the C2V messages received from the check node update module 244, and may store the updated values of the variable nodes in the second buffer 250.

In the second embodiment, the variable node update module 242 may update the values of the variable nodes based on the initial soft values, which are received from the buffer selected by the decoding controller 210 between the first buffer 230 and the second buffer 250, and the C2V messages, which are received from the check node update module 244. The variable node update module 242 may store the updated values of the variable nodes in the buffer selected by the decoding controller 210 between the first buffer 230 and the second buffer 250. For example, when the initial soft values are stored in the first buffer 230, the second buffer 250 may be selected to store the values of the variable nodes, whereas when the initial soft values are stored in the second buffer 250, the first buffer 230 may be selected to store the values of the variable nodes.

In the iteration subsequent to the first iteration, the check node update module 244 may update the values of the check nodes based on the V2C messages received from the variable node update module 242. The check node update module 244 may perform a syndrome check based on the values of the variable nodes and the parity check matrix. The check node update module 244 may notify the decoding controller 210 of the result of the syndrome check. When the syndrome check has passed in the iteration subsequent to the first iteration, an error correction decoding operation on read values corresponding to a next codeword may be performed, whereas when the syndrome check fails in the iteration subsequent to the first iteration, a next iteration may be performed.

In the first embodiment, the check node update module 244 may perform a syndrome check based on the values of the variable nodes, stored in the second buffer 250, and the parity check matrix.

In the second embodiment, the check node update module 244 may perform the syndrome check, based on the parity check matrix and the values of the variable nodes, stored in the buffer selected by the decoding controller 210 between the first buffer 230 and the second buffer 250.

Hereinafter, examples in which the error correction decoding operation is performed according to the first embodiment and the second embodiment are further described.

First Embodiment

The decoding controller 210 may control the mapper 220 and the node processor 240 so that the first error correction decoding operation is performed using first read values corresponding to a first codeword.

The mapper 220 may receive the first read values, and may generate first initial soft values based on the received first read values. The mapper 220 may store the generated first initial soft values in the first buffer 230.

The node processor 240 may perform an initialization step and a first iteration based on the first initial soft values stored in the first buffer 230. In the first iteration, only the values of check nodes may be updated, and without the values of variable nodes being updated. In the first iteration, the node processor 240 may perform a syndrome check using sign bits from the first initial soft values stored in the first buffer 230, and a parity check matrix.

1. Case Where Syndrome Check Passes in First Iteration of the First Error Correction Decoding Operation When the syndrome check passes in the first iteration of the first error correction decoding operation, the decoding controller 210 may control the first buffer 230 and the second buffer 250 so that the sign bits from the first initial soft values stored in the first buffer 230, are stored in the second buffer 250. Here, the sign bits stored in the second buffer 250 may be referred to as a "first hard decision vector". The decoding controller 210 may control the second buffer 250 so that the first hard decision vector stored in the second buffer 250 is output as a decoded codeword.

The decoding controller 210 may control the mapper 220 and the node processor 240 so that the second error correction decoding operation is performed using second read values corresponding to a second codeword. Accordingly, the mapper 220 may receive the second read values, and may generate second initial soft values based on the received second read values. The mapper 220 may store the generated second initial soft values in the first buffer 230. Here, the decoding controller 210 may control the mapper 220 so that the second initial soft values are generated and stored in the first buffer 230 before the first hard decision vector, stored in the second buffer 250, is output.

The node processor 240 may perform the second error correction decoding operation using the second initial soft values stored in the first buffer 230. Here, the decoding controller 210 may control the second buffer 250 so that the first hard decision vector, stored in the second buffer 250, is output before a first iteration of the second error correction decoding operation is performed.

2-1. Case Where Syndrome Check Fails in a First Iteration of the First Error Correction Decoding Operation or an Iteration Subsequent to First Iteration When a syndrome check fails in the first iteration of the first error correction decoding operation or in an iteration subsequent to the first iteration, the decoding controller 210 may control the node processor 240 so that a next iteration is performed. Accordingly, C2V messages and V2C messages may be transferred between the check node update module 244 and the variable node update module 242, and thus the values of the variable nodes and the values of the check nodes may be updated.

In the iteration subsequent to the first iteration, the variable node update module 242 may store the updated values of the variable nodes in the second buffer 250. The check node update module 244 may perform a syndrome check based on the values of the variable nodes, stored in the second buffer 250, and a parity check matrix.

2-2. Case Where Syndrome Check Passes in an Iteration Subsequent to First Iteration of the First Error Correction Decoding Operation In a case where the syndrome check passes in the iteration subsequent to the first iteration of the first error correction decoding operation, the decoding controller 210 may control the second buffer 250 so that the values of the variable nodes, stored in the second buffer 250, are output as a decoded codeword.

The decoding controller 210 may control the mapper 220 and the node processor 240 so that the second error correction decoding operation is performed using second read values corresponding to a second codeword. Accordingly, the mapper 220 may receive the second read values, and may generate second initial soft values based on the received second read values. The mapper 220 may store the generated second initial soft values in the first buffer 230. Herein, the decoding controller 210 may control the mapper 220 so that the second initial soft values are generated and stored in the first buffer 230 before the values of the variable nodes, stored in the second buffer 250, are output.

The node processor 240 may perform the second error correction decoding operation using the second initial soft values stored in the first buffer 230. Herein, the decoding controller 210 may control the second buffer 250 so that the values of the variable nodes, stored in the second buffer 250, are output before a first iteration of the second error correction decoding operation is performed.

Second Embodiment

The decoding controller 210 may select a buffer in which initial soft values are to be stored and a buffer in which the updated values of variable nodes are to be stored, between the first buffer 230 and the second buffer 250 whenever the error correction decoding operation corresponding to a single codeword is performed. Hereinafter, it is assumed that, when the first error correction decoding operation is performed using first read values corresponding to a first codeword, the first buffer 230 is selected as the buffer in which initial soft values are to be stored, and the second buffer 250 is selected as the buffer in which the updated values of variable nodes are to be stored.

The decoding controller 210 may control the mapper 220 and the node processor 240 so that the first error correction decoding operation is performed using the first read values corresponding to the first codeword.

The mapper 220 may receive the first read values, and may generate first initial soft values based on the received first read values. The mapper 220 may store the generated first initial soft values in the first buffer 230.

The node processor 240 may perform an initialization step and a first iteration based on the first initial soft values stored in the first buffer 230. In the first iteration, only the values of check nodes may be updated without the values of variable nodes being updated. In the first iteration, the node processor 240 may perform a syndrome check using sign bits from the first initial soft values stored in the first buffer 230, and a parity check matrix.

1. Case Where Syndrome Check Passes in a First Iteration of the First Error Correction Decoding Operation In a case where a syndrome check passes in the first iteration of the first error correction decoding operation, the decoding controller 210 may control the first buffer 230 so that sign bits from the first initial soft values stored in the first buffer 230, are output as a decoded codeword. Here, the sign bits from the first initial soft values stored in the first buffer 230, may be referred to as a "first hard decision vector".

The decoding controller 210 may control the mapper 220 and the node processor 240 so that the second error correction decoding operation is performed using second read values corresponding to a second codeword. Accordingly, the mapper 210 may receive the second read values, and may generate second initial soft values based on the received second read values.

Herein, the decoding controller 210 may select the second buffer 250 as the buffer in which the second initial soft values are to be stored. Accordingly, the mapper 220 may store the second initial soft values in the second buffer 250. Here, the decoding controller 210 may control the mapper 220 so that the second initial soft values are generated and stored in the second buffer 250 before the first hard decision vector, stored in the first buffer 230, is output.

The node processor 240 may perform the second error correction decoding operation using the second initial soft values stored in the second buffer 250. Here, the decoding controller 210 may control the first buffer 230 so that the first hard decision vector, stored in the first buffer 230, is output before a first iteration of the second error correction decoding operation is performed.

2-1. Case Where Syndrome Check Fails in a First Iteration of the First Error Correction Decoding Operation or an Iteration Subsequent to First Iteration When a syndrome check fails in the first iteration of the first error correction decoding operation or in the iteration subsequent to the first iteration, the decoding controller 210 may control the node processor 240 so that a next iteration is performed. Accordingly, C2V messages and V2C messages may be transferred between the check node update module 244 and the variable node update module 242, and thus the values of the variable nodes and the values of the check nodes may be updated.

In the iteration subsequent to the first iteration, the variable node update module 242 may store the updated values of the variable nodes in the second buffer 250. The check node update module 244 may perform a syndrome check based on the values of the variable nodes, stored in the second buffer 250, and a parity check matrix.

2-2. Case Where Syndrome Check Passes in an Iteration Subsequent to First Iteration of the First Error Correction Decoding Operation In a case where the syndrome check passes in the iteration subsequent to the first iteration of the first error correction decoding operation, the decoding controller 210 may control the second buffer 250 so that the values of the variable nodes, stored in the second buffer 250, are output as a decoded codeword.

The decoding controller 210 may control the mapper 220 and the node processor 240 so that the second error correction decoding operation is performed using second read values corresponding to a second codeword. Accordingly, the mapper 220 may receive the second read values, and may generate second initial soft values based on the received second read values. Herein, the decoding controller 210 may select the first buffer 230 as the buffer in which the second initial soft values are to be stored. Accordingly, the mapper 220 may store the second initial soft values in the first buffer 230. Herein, the decoding controller 210 may control the mapper 220 so that the second initial soft values are generated and stored in the first buffer 230 before the values of the variable nodes, stored in the second buffer 250, are output.

The node processor 240 may perform the second error correction decoding operation using the second initial soft values stored in the first buffer 230. Herein, the decoding controller 210 may control the second buffer 250 so that the values of the variable nodes, stored in the second buffer 250, are output before a first iteration of the second error correction decoding operation is performed.

Figure 10:
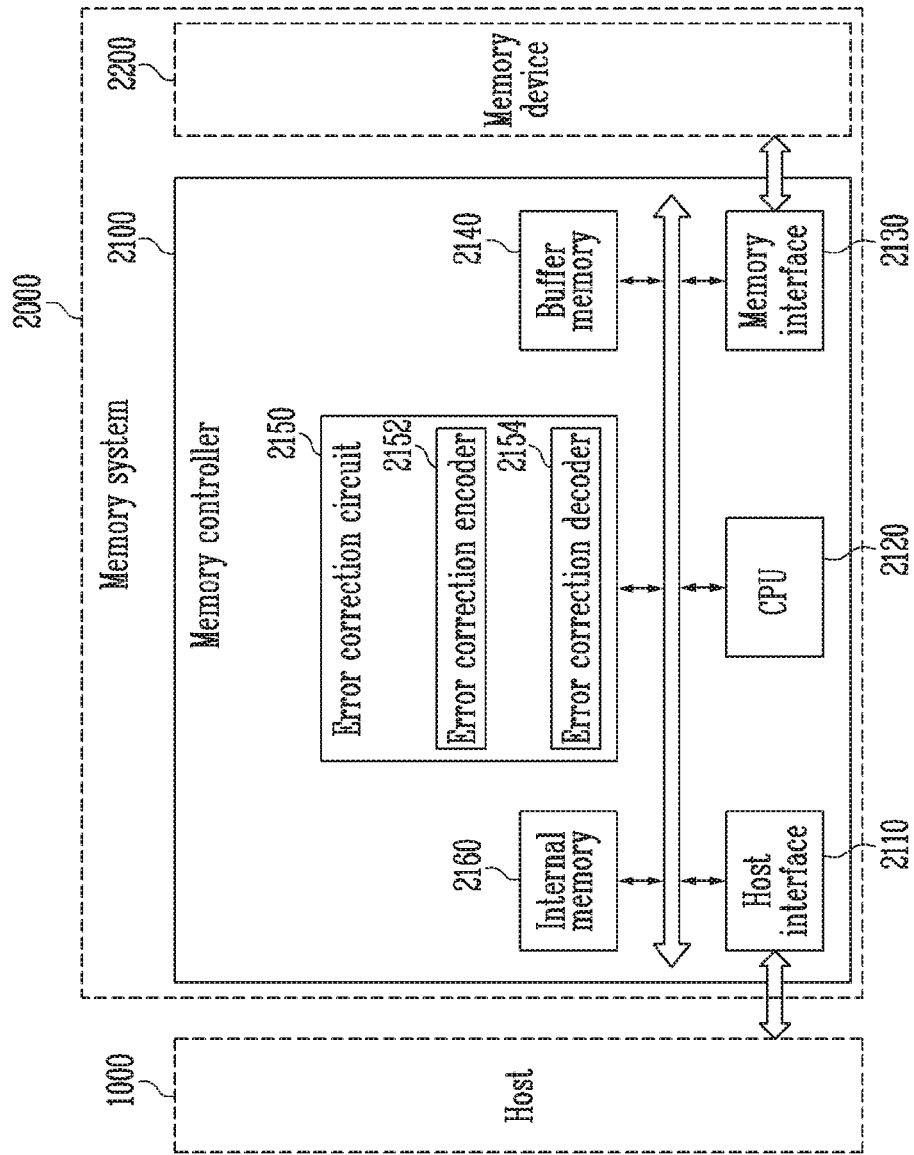
FIG. 10 is a diagram illustrating a memory system according to an embodiment of the present disclosure.

FIG. 10 is a diagram illustrating a memory system according to an embodiment of the present disclosure.

As illustrated in FIG. 10, a memory system 2000 may include a memory device 2200 which stores data, and a memory controller 2100 which controls the memory device 2200 under the control of a host 1000.

In some embodiments, the host 1000 may be a device or a system which stores data in the memory system 2000 or retrieves data from the memory system 2000. For example, the host 1000 may include at least one of a computer, a portable digital device, a tablet, a digital camera, a digital audio player, a television, a wireless communication device, or a cellular phone, but embodiments of the present disclosure are not limited thereto.

In some embodiments, the memory controller 2100 may control the overall operation of the memory system 2000. The memory controller 2100 may perform various operations in response to requests received from the host 1000. For example, the memory controller 2100 may perform a program operation, a read operation, an erase operation, etc. on the memory device 2200. During a program operation, the memory controller 2100 may transmit a program command, an address, a codeword, etc. to the memory device 2200. During a read operation, the memory controller 2100 may transmit a read command, an address, etc. to the memory device 2200, and may receive read data corresponding to a codeword from the memory device 2200. During an erase operation, the memory controller 2100 may transmit an erase command, an address, etc. to the memory device 2200.

In some embodiments, the memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

In some embodiments, the host interface 2110 may transfer a program request, a read request, and an erase request, which are received from the host 1000, to the CPU 2120. During a program operation, the host interface 2110 may receive original data, corresponding to the program request, from the host 1000, and may store the received original data in the buffer memory 2140. During a read operation, the host interface 2110 may transmit a decoded codeword, stored in the buffer memory 2140, to the host 1000. The host interface 2110 may communicate with the host 1000 using various interface protocols. For example, the host interface 2110 may communicate with the host 1000 using at least one of interface protocols, such as Non-Volatile Memory express (NVMe), Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer System Interface (SCSI), or serial attached SCSI (SAS), but embodiments of the present disclosure are not limited thereto.

In some embodiments, the CPU 2120 may perform various types of calculations (operations) or generate commands and addresses so as to control the memory device 2200. For example, the CPU 2120 may generate various commands and addresses required for a program operation, a read operation, and an erase operation in response to requests received from the host interface 2110.

When the program request is received from the host interface 2110, the CPU 2120 may control the error correction circuit 2150 so that error correction encoding is performed on the original data stored in the buffer memory 2140. When notification that a codeword has been generated is received from the error correction circuit 2150, the CPU 2120 may generate a program command and an address, and may control the memory interface 2130 so that the generated program command and address and the codeword stored in the buffer memory 2140 are transmitted to the memory device 2200.

When the read request is received from the host interface 2110, the CPU 2120 may generate a read command and an address, and may control the memory interface 2130 so that the generated read command and address are transmitted to the memory device 2200. When notification that the read data has been received is received from the memory interface 2130, the CPU 2120 may control the error correction circuit 2150 so that the error correction decoding operation is performed on the read data stored in the buffer memory 2140. When notification that a decoded codeword has been generated is received from the error correction circuit 2150, the CPU 2120 may control the host interface 2110 so that the decoded codeword stored in the buffer memory 2140 is transmitted to the host 1000.

In some embodiments, the memory interface 2130 may communicate with the memory device 2200 using various interface protocols.

During a program operation, the memory interface 2130 may transmit the program command and the address, received from the CPU 2120, and the codeword, stored in the buffer memory 2140, to the memory device 2200.

During a read operation, the memory interface 2130 may transmit the read command and the address, received from the CPU 2120, to the memory device 2200. During the read operation, the memory interface 2130 may store read data, received from the memory device 2200, in the buffer memory 2140, and may notify the CPU 2120 that the read data has been received.

In some embodiments, the buffer memory 2140 may temporarily store data while the memory controller 2100 controls the memory device 2200.

During the program operation, the buffer memory 2140 may store the original data received from the host interface 2110 and transmit the stored original data to the error correction circuit 2150. During a program operation, the buffer memory 2140 may store the codeword received from the error correction circuit 2150, and may transmit the stored codeword to the memory interface 2130.

During the read operation, the buffer memory 2140 may store the read data received from the memory device 2200 and transmit the stored read data to the error correction circuit 2150. During the read operation, the buffer memory 2140 may store the decoded codeword received from the error correction circuit 2150, and may transmit the stored decoded codeword to the host interface 2110.

In some embodiments, the error correction circuit 2150 may perform error correction encoding on the original data, and may perform an error correction decoding operation on the read data. The error correction circuit 2150 may have a predetermined error correction capability. For example, when the number of error bits that do not exceed the error correction capability are present in the read data, the error correction circuit 2150 may detect and correct the error included in the read data. The maximum number of error bits that do not exceed the error correction capability of the error correction circuit 2150 may be regarded as the maximum allowable number of error bits. The error correction circuit 2150 may be an error correction circuit that uses an LDPC code.

The error correction circuit 2150 may include an error correction encoder 2152 and an error correction decoder 2154.

The error correction encoder 2152 may generate a codeword by performing error correction encoding on the original data received from the buffer memory 2140. The error correction encoder 2152 may transmit the generated codeword to the buffer memory 2140, and may notify the CPU 2120 that the codeword has been generated. The basic configuration and operation of the error correction encoder 2152 may be identical to those of an error correction encoder 100, described above with reference to FIG. 1.

The error correction decoder 2154 may generate a decoded codeword by performing an error correction decoding operation on the read data received from the buffer memory 2140. The error correction decoder 2154 may transmit the decoded codeword to the buffer memory 2140, and may notify the CPU 2120 that the decoded codeword has been generated. When the error included in the read data cannot be corrected, the error correction decoder 2154 may notify the CPU 2120 that error correction decoding has failed. The basic configuration and operation of the error correction decoder 2154 may be identical to those of an error correction decoder 200, described above with reference to FIG. 1.

In some embodiments, the internal memory 2160 may be used as a storage which stores various types of information required for the operation of the memory controller 2100. The internal memory 2160 may store a plurality of tables. In some embodiments, the internal memory 2160 may store an address mapping table in which logical addresses are mapped to physical addresses.

In some embodiments, the memory device 2200 may perform a program operation, a read operation, an erase operation, a data compression operation, and a copyback operation under the control of the memory controller 2100. The memory device 2200 may be implemented as a volatile memory device in which stored data is lost when the supply of power is interrupted or as a nonvolatile memory device in which stored data is retained even when the supply of power is interrupted.

The memory device 2200 may receive a command, an address, and a codeword from the memory controller 2100, and may store the codeword in response to the command and the address.

The memory device 2200 may perform a read operation on the codeword in response to the command and the address received from the memory controller 2100, and may provide read values to the memory controller 2100.

Figure 11:
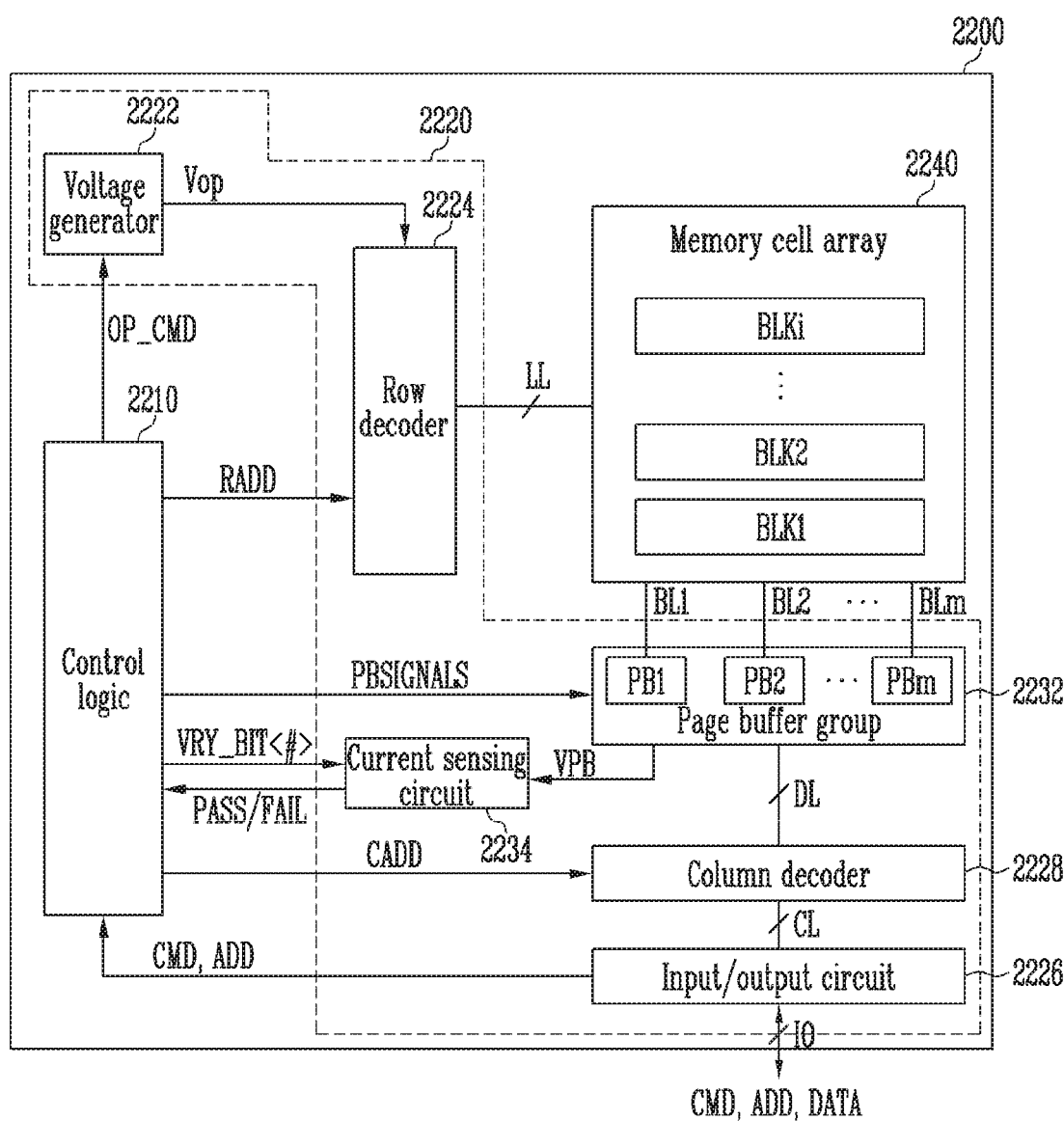
FIG. 11 is a diagram illustrating memory device according to an embodiment of the present disclosure.

FIG. 11 is a diagram illustrating a memory device according to some embodiments of the presently disclosed technology. In an example, the memory device illustrated in FIG. 11 may be applied to the memory system illustrated in FIG. 9.

The memory device 2200 may include a control logic 2210, peripheral circuits 2220 and a memory cell array 2240. The peripheral circuits 2220 may include a voltage generator 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 10.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generator 2222 may generate various operating voltages Vop that are used for the program, read, and erase operations in response to the operation signal OP_CMD received from the control logic 2210. For example, the voltage generator 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CARD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers Pa1 to PBm coupled to the bit lines BL1 to BLm, respectively. For example, one page buffer may be coupled to each of the bit lines. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Embodiments of the disclosed technology include an error correction decoder that comprises a mapper configured to generate, based on a first set of read values corresponding to a first codeword, a first set of log likelihood ratio (LLR) values; a first buffer, coupled to the mapper, configured to store the first set of LLR values received from the mapper; and a node processor, coupled to the first buffer, configured to perform a first error correction decoding operation using the first set of LLR values received from the first buffer, wherein a first iteration of the first error correction decoding operation comprises refraining from updating values of one or more variable nodes, and performing a syndrome check using a parity check matrix and sign bits of the first set of LLR values stored in the first buffer.

In some embodiments, a second buffer is coupled to the node processor and the mapper; and a decoding controller, coupled to the node processor, to the mapper, and to the first buffer and the second buffer, configured to store the sign bits in the second buffer upon a determination that the syndrome check has passed in the first iteration of the first error correction decoding operation.

In some embodiments, the decoding controller is further configured to output the sign bits stored in the second buffer as a decoded codeword.

In some embodiments, the mapper is further configured, prior to the sign bits stored in the second buffer being output, to generate a second set of LLR values based on a second set of read values corresponding to a second codeword; and store the second set of LLR values in the first buffer.

In some embodiments, the node processor is further configured to perform a second error correction decoding operation using the second set of LLR values stored in the first buffer, and the decoding controller is further configured, prior to a first iteration of the second error correction decoding operation being performed, to output the sign bits stored in the second buffer.

In some embodiments, a second buffer is coupled to the node processor and the mapper, the node processor is further configured to perform iterations subsequent to the first iteration upon a determination that the syndrome check has failed in the first iteration of the first error correction decoding operation, and store values of variable nodes that are updated in the iterations subsequent to the first iteration in the second buffer, wherein the iterations subsequent to the first iteration are performed upon a determination that a maximum number of iterations has not been exceeded.

In some embodiments, the node processor is further configured to perform a syndrome check using the parity check matrix and the values of the variable nodes stored in the second buffer in the iterations subsequent to the first iteration.

In some embodiments, the decoding controller is further configured to output the values of the variable nodes stored in the second buffer as a decoded codeword upon a determination that the syndrome check based on the values of the variable nodes stored in the second buffer has passed.

In some embodiments, the mapper is further configured, prior to the values of the variable nodes stored in the second buffer being output, to generate a second set of LLR values based on a second set of read values corresponding to a second codeword, and store the second set of LLR values in the first buffer.

In some embodiments, a decoding controller is configured to output the sign bits as a decoded codeword upon a determination that the syndrome check has passed in the first iteration of the first error correction decoding operation.

In some embodiments, a second buffer is coupled to the node processor and the mapper, wherein the mapper is further configured to generate a second set of values based on a second set of read values corresponding to a second codeword, and store the second set of LLR values in the second buffer.

In some embodiments, the mapper is configured, prior to the sign bits stored in the first buffer being output, to generate the second set of LLR values and store the second set of LLR values in the second buffer.

In some embodiments, the node processor is further configured to perform a second error correction decoding operation using the second set of LLR values stored in the second buffer.

In some embodiments, the decoding controller is further configured, prior to a first iteration of the second error correction decoding operation being performed, to output the sign bits stored in the first buffer.

In some embodiments, the first error correction decoding operation comprises a vertically shuffled scheduling operation.

Embodiments of the disclosed technology further include a method for error correction decoding that comprises generating, based on a first set of read values corresponding to a first codeword, a first set of log likelihood ratio (LLR) values; storing the first set of LLR values in a first buffer; and performing a first error correction decoding operation using the first set of LLR values, wherein a first iteration of the first error correction decoding operation comprises refraining from updating values of one or more variable nodes, and performing a syndrome check using a parity check matrix and sign bits of the first set of LLR values stored in the first buffer.

In some embodiments, the method further comprises the operation of storing the sign bits in a second buffer upon a determination that the syndrome check has passed in the first iteration of the first error correction decoding operation.

In some embodiments, the method further comprises the operation of outputting the sign bits stored in the second buffer as a decoded codeword.

In some embodiments, the method further comprises the operation of generating, prior to outputting the sign bits, a second set of LLR values based on a second set of read values corresponding to a second codeword; and storing the second set of LLR values in the first buffer.

In some embodiments, the method further comprises the operation of performing a second error correction decoding operation using the second set of LLR values stored in the first buffer; and outputting, prior to performing a first iteration of the second error correction decoding operation, the sign bits stored in the second buffer.

In some embodiments, the method further comprises the operation of performing iterations subsequent to the first iteration upon a determination that the syndrome check has failed in the first iteration of the first error correction decoding operation; and storing values of variable nodes that are updated in the iterations subsequent to the first iteration in a second buffer, wherein the iterations subsequent to the first iteration are performed upon a determination that a maximum number of iterations has not been exceeded.

In some embodiments, the method further comprises the operation of performing a syndrome check using the parity check matrix and the values of the variable nodes stored in the second buffer in the iterations subsequent to the first iteration.

In some embodiments, the method further comprises the operation of outputting the values of the variable nodes stored in the second buffer as a decoded codeword upon a determination that the syndrome check based on the values of the variable nodes stored in the second buffer has passed.

In some embodiments, the method further comprises the operation of generating, prior to outputting the values of the variable nodes stored in the second buffer, a second set of LLR values based on a second set of read values corresponding to a second codeword; and storing the second set of LLR values in the first buffer.

In some embodiments, the method further comprises the operation of outputting the sign bits as a decoded codeword upon a determination that the syndrome check has passed in the first iteration of the first error correction decoding operation.

In some embodiments, the method further comprises the operation of generating a second set of LLR values based on a second set of read values corresponding to a second codeword; and storing the second set of LLR values in the second buffer.

In some embodiments, the second set of LLR values are generated and stored prior to outputting the sign bits stored in the first buffer.

In some embodiments, the method further comprises the operation of performing a second error correction decoding operation using the second set of LLR values stored in the second buffer.

In some embodiments, the method further comprises the operation of outputting, prior to performing a first iteration of the second error correction decoding operation, the sign bits stored in the first buffer.

Figure 12:
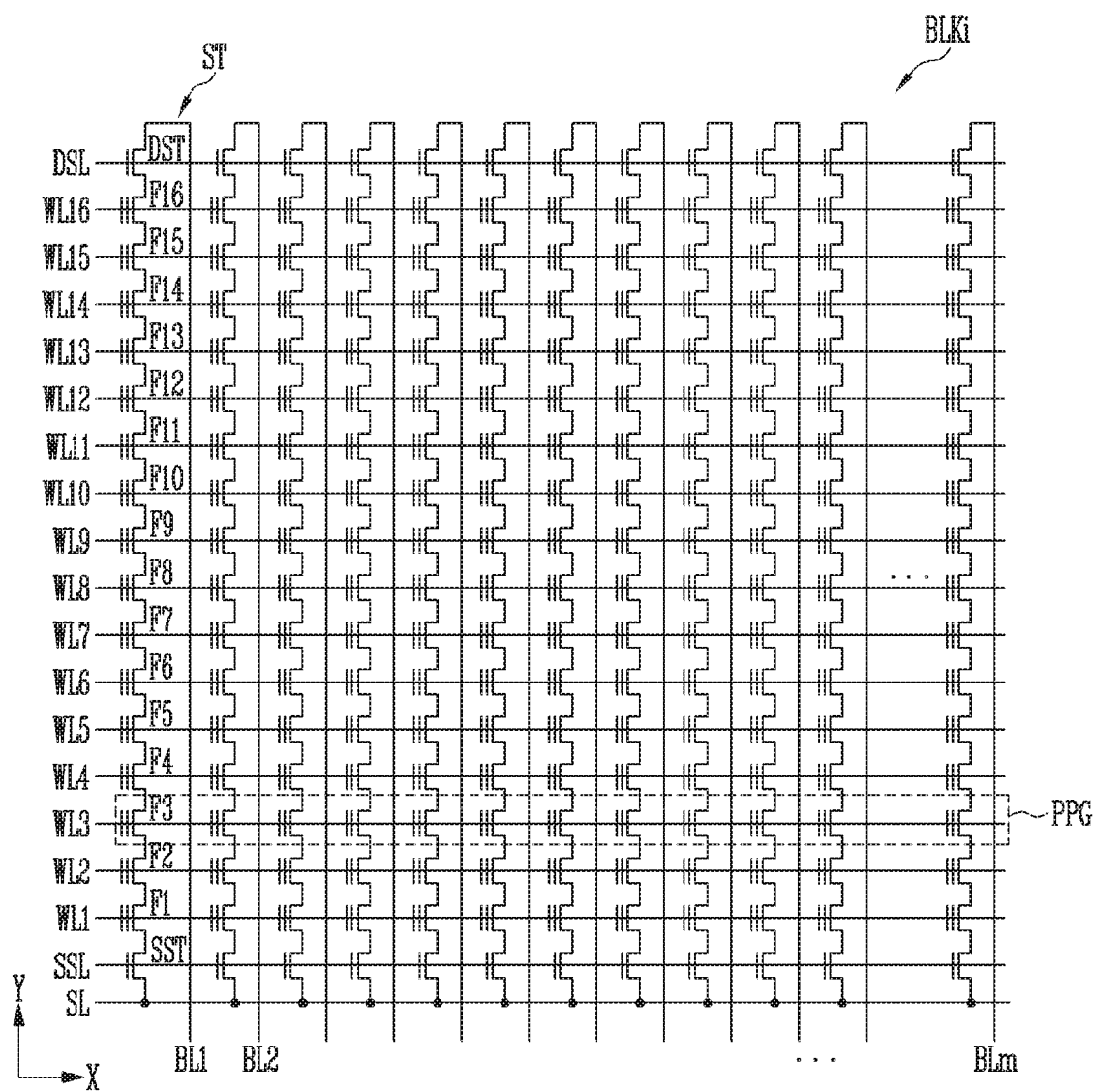
FIG. 12 is an example diagram illustrating a memory block.

FIG. 12 is an example diagram illustrating a memory block.

A memory cell array may include a plurality of memory blocks, and to simplify the description, any one memory block BLKi of the plurality of memory blocks is illustrated in FIG. 12.

As illustrated therein, a plurality of word lines arranged in parallel to each other between a first select line and a second select line may be coupled to the memory block BLKi. Herein, the first select line may be a source select line SSL, and the second select line may be a drain select line DSL. For example, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells FT to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG The data corresponding to one logical page LPG may include a number of data bits identical to the number of cells included in one physical page PPG For example, when two or more bits of data are stored in one memory cell, one physical page PPG may store data corresponding to two or more logical pages LPG For example, in a memory device driven in an MLC type, data corresponding to two logical pages may be stored in one physical page PPG In a memory device driven in a TLC type, data corresponding to three logical pages may be stored in one physical page PPG.

Figure 13:
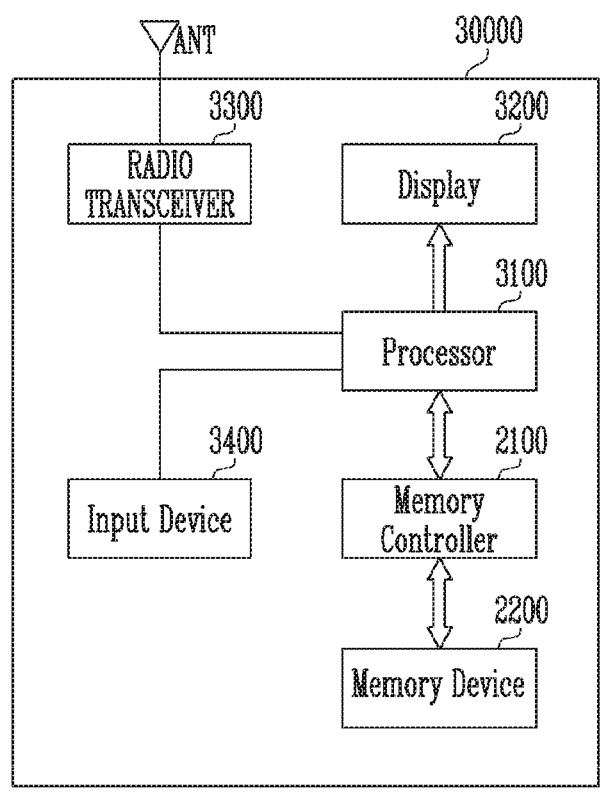
FIGS. 13 and 14 are diagrams illustrating embodiments of a memory system including a memory controller of FIG. 10.

FIG. 13 is a diagram illustrating an embodiment of a memory system that includes the memory controller of FIG. 10.

As illustrated in FIG. 13, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control the data access operation of the memory device 2200, e.g., a program operation, an erase operation or a read operation, under the control of a processor 3100.

Data programmed in the memory device 2200 may be output through a display 3200 under the control of the memory controller 2100.

A radio transceiver 3300 may send and receive radio signals through an antenna (ANT). For example, the radio transceiver 3300 may change a radio signal received through the antenna into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 14:
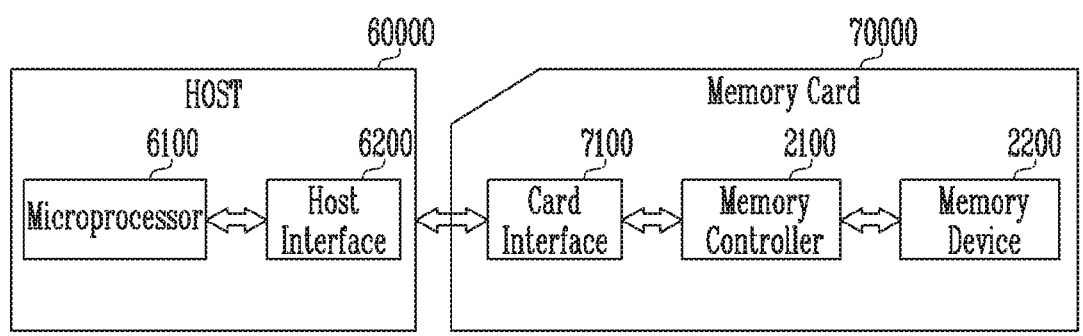

FIG. 14 is a diagram illustrating an embodiment of a memory system that includes the memory controller of FIG. 10.

As illustrated in FIG. 14, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Herein, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor 6100.

In accordance with the presently disclosed technology, the number of buffers required for error correction decoding may be decreased, and thus the size of an error correction decoder may be reduced.

While the disclosed technology has been shown and described with reference to certain exemplary embodiments thereof, it will be understood by those skilled in the art that various changes in form and details may be made therein without departing from the spirit and scope of the disclosed technology as defined by the appended claims and their equivalents. Therefore, the scope of the disclosed technology should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. That is, it should be apparent to those skilled in the art that various modifications can be made on the basis of the technological scope of the disclosed technology.

Meanwhile, the exemplary embodiments of the disclosed technology have been described in the drawings and specification. Although specific terminologies are used here, those are only to explain the embodiments of the disclosed technology. Therefore, the disclosed technology is not restricted to the above-described embodiments and many variations are possible within the spirit and scope of the disclosed technology. It should be apparent to those skilled in the art that various modifications can be made on the basis of the technological scope of the disclosed technology in addition to the embodiments disclosed herein.

What is claimed is:

1. An error correction decoder, comprising:
a mapper configured to generate, based on a first set of read values corresponding to a first codeword, a first set of log likelihood ratio (LLR) values;
a first buffer, coupled to the mapper, configured to store the first set of LLR values received from the mapper;
a node processor, coupled to the first buffer, configured to perform a first error correction decoding operation using the first set of LLR values received from the first buffer; and
a second buffer coupled to the node processor and the mapper,
wherein a first iteration of the first error correction decoding operation comprises:
holding values of one or more variable nodes during updating values of one or more check nodes, and
performing a syndrome check using a parity check matrix and sign bits of the first set of LLR values stored in the first buffer, and
wherein the node processor is further configured to:
perform iterations subsequent to the first iteration upon a determination that the syndrome check has failed in the first iteration of the first error correction decoding operation, and
store the values of the one or more variable nodes that are updated in the iterations subsequent to the first iteration in the second buffer.

2. The error correction decoder of claim 1, further comprising:
a decoding controller, coupled to the node processor, to the mapper, and to the first buffer and the second buffer, configured to store the sign bits in the second buffer upon a determination that the syndrome check has passed in the first iteration of the first error correction decoding operation.

3. The error correction decoder of claim 2, wherein the decoding controller is further configured to output the sign bits stored in the second buffer as a decoded codeword.

4. The error correction decoder of claim 3, wherein the mapper is further configured, prior to the sign bits stored in the second buffer being output, to:
generate a second set of LLR values based on a second set of read values corresponding to second codeword; and
store the second set of LLR values in the first buffer.

5. The error correction decoder of claim 4, wherein the node processor is further configured to perform a second error correction decoding operation using the second set of LLR values stored in the first buffer, and the decoding controller is further configured, prior to a first iteration of the second error correction decoding operation being performed, to output the sign bits stored in the second buffer.

6. The error correction decoder of claim 1,
wherein the iterations subsequent to the first iteration are performed upon a determination that a maximum number of iterations has not been exceeded.

7. The error correction decoder of claim 6, wherein the node processor is further configured to perform a syndrome check using the parity check matrix and the values of the variable nodes stored in the second buffer in the iterations subsequent to the first iteration.

8. The error correction decoder of claim 7, wherein a decoding controller is configured to output the values of the variable nodes stored in the second buffer as a decoded codeword upon a determination that the syndrome check based on the values of the variable nodes stored in the second buffer has passed.

9. The error correction decoder of claim 8, wherein the mapper is further configured, prior to the values of the variable nodes stored in the second buffer being output, to:
generate a second set of LLR values based on a second set of read values corresponding to a second codeword, and
store the second set of LLR values in the first buffer.

10. The error correction decoder of claim 1, further comprising:
a decoding controller configured to output the sign bits as a decoded codeword upon a determination that the syndrome check has passed in the first iteration of the first error correction decoding operation.

11. The error correction decoder of claim 10,
wherein the mapper is further configured to:
generate a second set of LLR values based on a second set of read values corresponding to a second codeword, and
store the second set of LLR values in the second buffer.

12. The error correction decoder of claim 11, wherein the mapper is configured, prior to the sign bits stored in the first buffer being output, to generate the second set of UR values and store the second set of LLR values in the second buffer.

13. The error correction decoder of claim 11, wherein the node processor is further configured to perform a second error correction decoding operation using the second set of LLR values stored in the second buffer.

14. The error correction decoder of claim 13, wherein the decoding controller is further configured, prior to a first iteration of the second error correction decoding operation being performed, to output the sign bits stored in the first buffer.

15. The error correction decoder of claim 1, wherein the first error correction decoding operation comprises a vertically shuffled scheduling operation.

16. A method for error correction decoding, comprising:
generating, based on a first set of read values corresponding to a first codeword, a first set of log likelihood ratio (LLR) values;
storing the first set of LLR values in a first buffer;
performing a first error correction decoding operation using the first set of LLR values,
wherein a first iteration of the first error correction decoding operation comprises:
holding values of one or more variable nodes during updating values of one or more check nodes, and
performing a syndrome check using a parity check matrix and sign bits of the first set of LLR values stored in the first buffer;
performing iterations subsequent to the first iteration upon a determination that the syndrome check has failed in the first iteration of the first error correction decoding operation; and
storing the values of the one or more variable nodes that are updated in the iterations subsequent to the first iteration in a second buffer.

17. The method of claim 16, further comprising:
storing the sign bits in the second buffer upon a determination that the syndrome check has passed in the first iteration of the first error correction decoding operation.

18. The method of claim 16,
wherein the iterations subsequent to the first iteration are performed upon a determination that a maximum number of iterations has not been exceeded.

19. The method of claim 16, further comprising: outputting the sign bits as a decoded codeword upon a determination that the syndrome check has passed in the first iteration of the first error correction decoding operation.

20. The method of claim 16, wherein the first error correction decoding operation comprises a vertically shuffled scheduling operation.

* * * * *